United States Patent [19]

Tanaka et al.

[11] 4,363,048
[45] Dec. 7, 1982

[54] TIME COUNTING CLOCK GENERATOR

[75] Inventors: Shosuke Tanaka, Yokohama; Fumiyoshi Abe, Atsugi, both of Japan

[73] Assignee: Sony Corporation, Tokyo, Japan

[21] Appl. No.: 208,433

[22] Filed: Nov. 19, 1980

[30] Foreign Application Priority Data

Nov. 27, 1979 [JP] Japan ................................. 54-153406

[51] Int. Cl.³ ...................... G11B 19/26; G11B 15/54; G11B 15/44
[52] U.S. Cl. ..................................... 360/137; 242/186
[58] Field of Search .................. 360/137, 14, 71, 72.2, 360/72.3, 73, 74.2; 242/186, 191, 203; 318/6–7, 327

[56] References Cited

U.S. PATENT DOCUMENTS

| | | | |
|---|---|---|---|
| 3,681,523 | 8/1972 | Sidline | 360/14 |
| 4,037,260 | 7/1977 | Busby, Jr. et al. | 360/73 |
| 4,139,872 | 2/1979 | Tachi | 360/14 |
| 4,146,910 | 3/1979 | Oliver et al. | 360/73 |
| 4,157,488 | 6/1979 | Allan | 242/186 |
| 4,161,001 | 7/1979 | Sakamoto | 360/14 |
| 4,215,378 | 7/1980 | Sato et al. | 360/74.2 |

*Primary Examiner*—Alfred H. Eddleman
*Attorney, Agent, or Firm*—Hill, Van Santen, Steadman, Chiara & Simpson

[57] ABSTRACT

A counting clock generator for a video tape recorder, in which two different phase counter clock signals at a pulse repetition frequency corresponding to the running speed of a tape are processed to obtain a direction detection signal indicating the direction of running of the tape and a clock signal at a frequency of predetermined times that of the two different phase counter clock signals, and the clock signal thus obtained is counted by a reversible counter, which is controlled for switching between up-counting and down-counting by the direction detecting signal with data "0" preset when the tape is running forward and data "maximum value" preset when the tape is running backward, for producing two revised counter clock signals of different phases according to the count output signal from the reversible counter.

7 Claims, 29 Drawing Figures

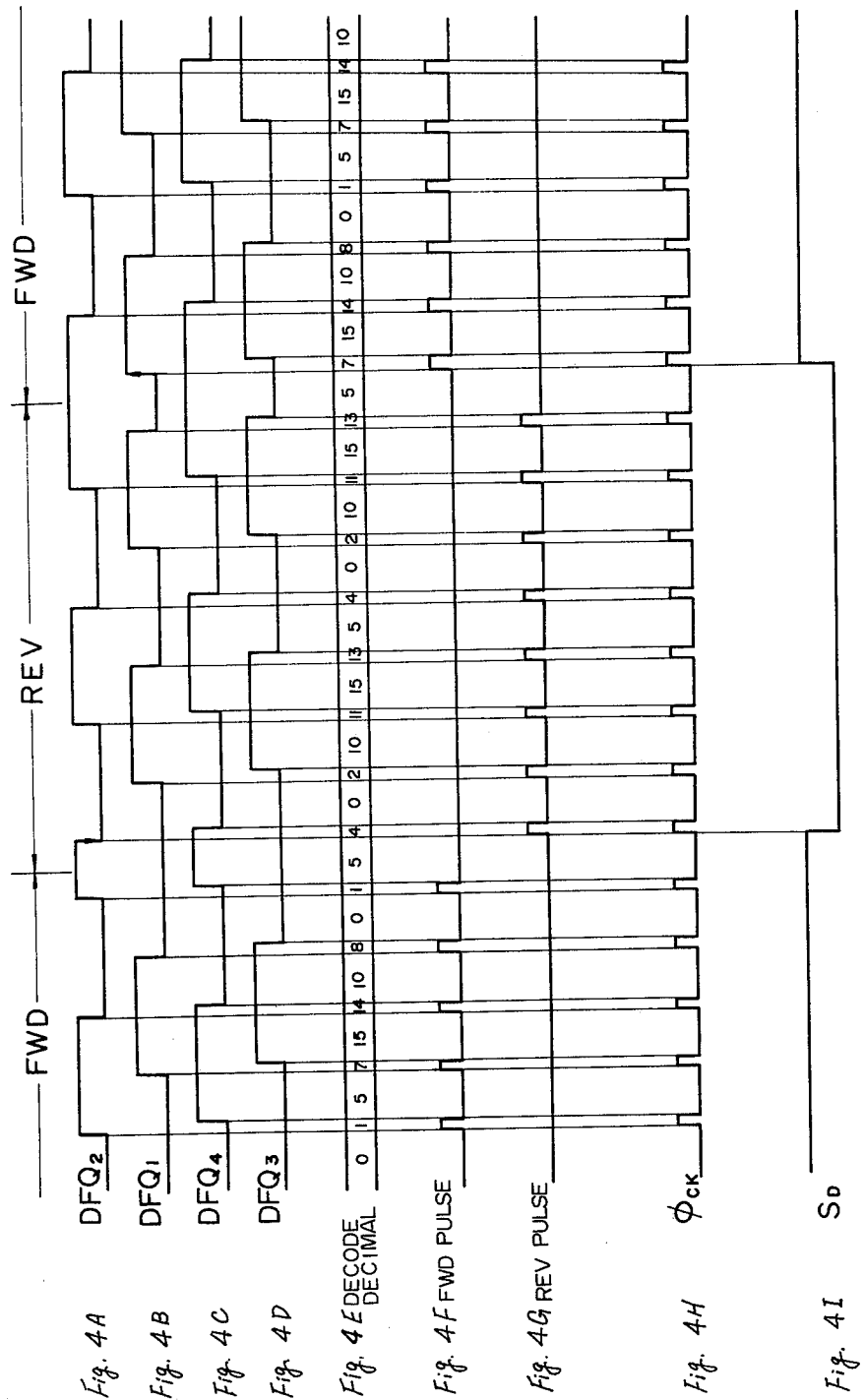

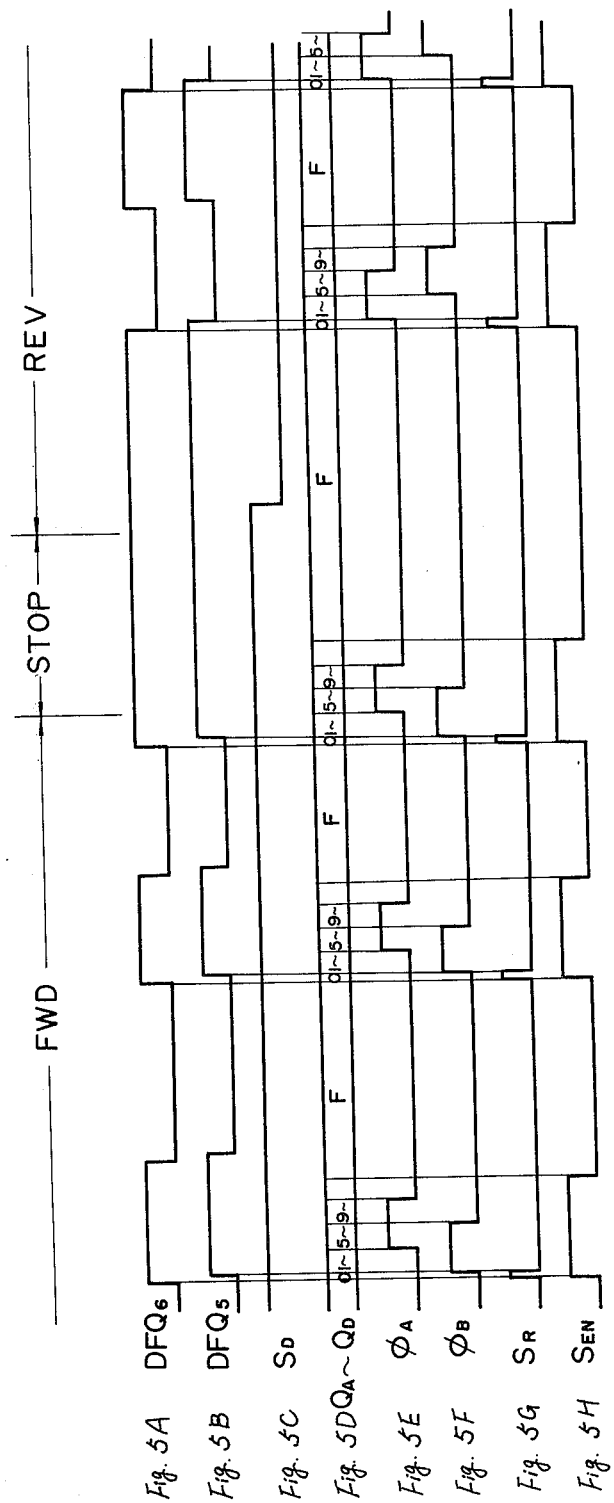

TIME COUNTING CLOCK GENERATOR

BACKGROUND OF THE INVENTION

1. Field of the Invention:

This invention generally relates to a timer counting clock generator, and more particularly to such timer counting clock generator that is applied to a video tape recorder.

2. Description of the Prior Art:

In the apparatus where a tape is driven such as a video tape recorder, it is usually necessary to provide a function of detecting and displaying the residual amount of the tape or prevailing position thereof. Particularly, it is necessary to accurately detect and display the prevailing tape position in case of automatically editing video tape programs with a video tape recorder.

Hitherto, it has been the practice to detect the position of the tape being driven by a tape driving device by detecting the relative position of the tape through the counting of count pulses obtained from a counter roller rotated with the movement of the tape or by detecting the relative position of the tape by the counting of count pulses of a control signal recorded on the tape or by detecting the absolute address through reproduction of the SMPTE (the society of Motion Picture and Television Engineers) time code previously recorded on tape.

However, by the afore-mentioned detection method using a counter roller, slip exists between the video tape and roller, so that it is difficult to obtain a correct display of the tape position.

Also, by the method of counting the control signal, it is difficult to correctly detect the tape position due to the reduction of the output at the slow tape speed and signal drop out.

In particular, with the above prior art systems inaccurate counting is liable to result in case the direction of running the tape is changed a number of times.

SUMMARY OF THE INVENTION

It is a primary object of the present invention to provide a new tape timer circuit.

It is a secondary object of the present invention to provide a novel time counting clock generating circuit.

It is a further object of the present invention to provide a newly designed tape time counting clock generating circuit which can be applied to a video tape recorder.

According to the present invention, a tape counter roller generates counter clock pulses which have frequencies proportional to speeds of a video tape. The generated counter clock pulses are fed to a counter circuit to which a control track pulse produced from a control track of the video tape is fed in order to correct the generation of the tape time counting clock.

The correction of the counter operation is done such that if the video tape is running forward, the counter is preset to zero at the occurrence of the produced control track pulse, and if the video tape is running backward, the counter is preset to a maximum value at the occurrence of the reproduced control track pulse.

Thus, a revised or corrected tape time counting clock pulse is obtained at an output of the counter.

In the actual circuit arrangement, a programmable read only memory is utilized in the circuit.

The above-mentioned and other objects and features of the invention will become apparent from the following detailed description taken in conjunction with the drawings which illustrate embodiments of the invention.

BRIEF DESCRIPTION OF THE DRAWINGS

FIGS. 4A–14 4I are time charts illustrating the operation of a first programmable read only memory used in the above embodiment; and FIGS. 5A–H are time charts illustrating the operation of a second programmable read only memory.

DESCRIPTION OF THE PREFERRED EMBODIMENTS

Figure 1:
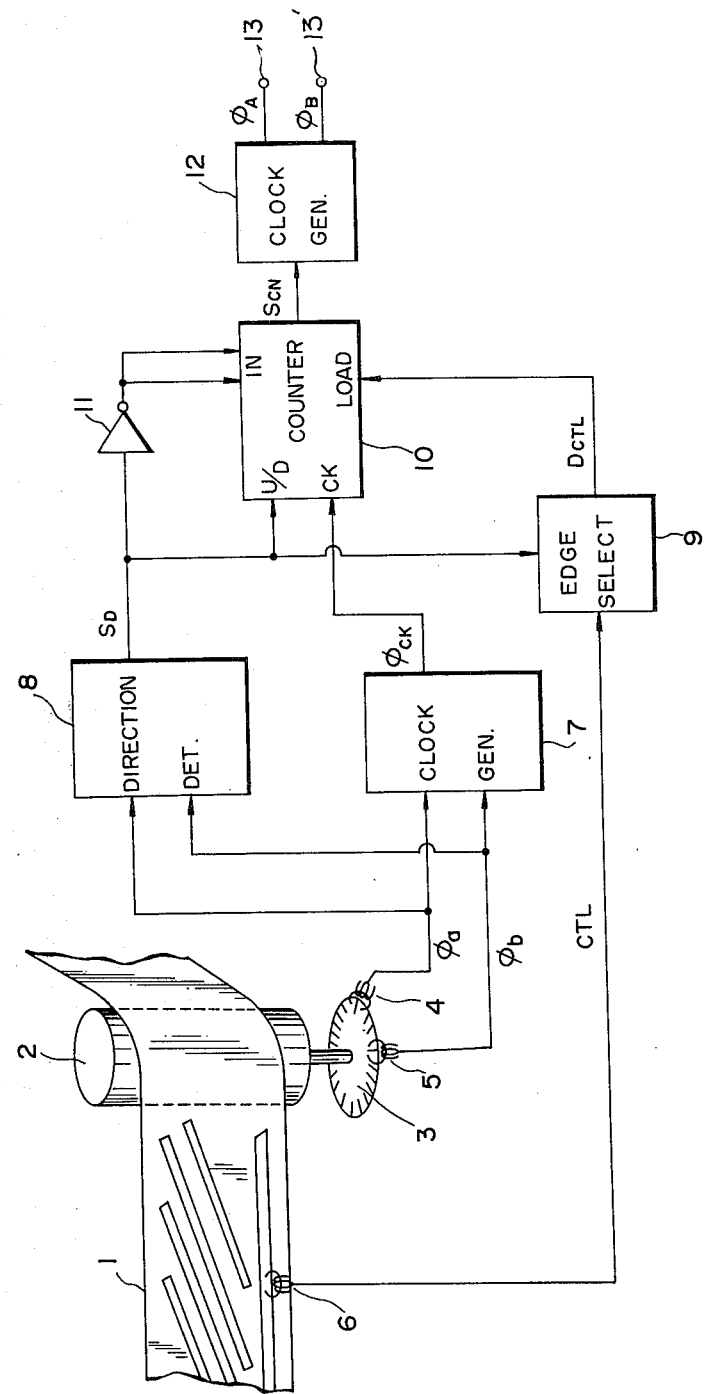
FIG. 1 is a block diagram showing the principal construction of an embodiment of the time counting clock generator according to the present invention.

FIG. 1 shows the principle construction according to the present invention. In the Figure, a video tape 1 rotates a counter roller 2. The counter roller 2 has a magnetic wheel 3, and a pair of magnetic pick-up heads 4 and 5 are provided to face the magnetic wheel. A control track head 6 reproduces control signal pulses (CTL pulses) from the video tape 1. Where NTSC (National Television System Committee) color television signal is recorded on the video tape, the CTL pulses constitute a pulse signal at 30 Hz in the normal reproducing mode in case of a helical scan video tape recorder. The magnetic pick-up heads 4 and 5 are located at such positions that their respective output pulse signals $\phi_a$ and $\phi_b$ are 90 degrees out of phase with respect to each other. The frequency of the counter clock signals $\phi_a$ and $\phi_b$ thus obtained corresponds to the tape running speed.

Figure 2:
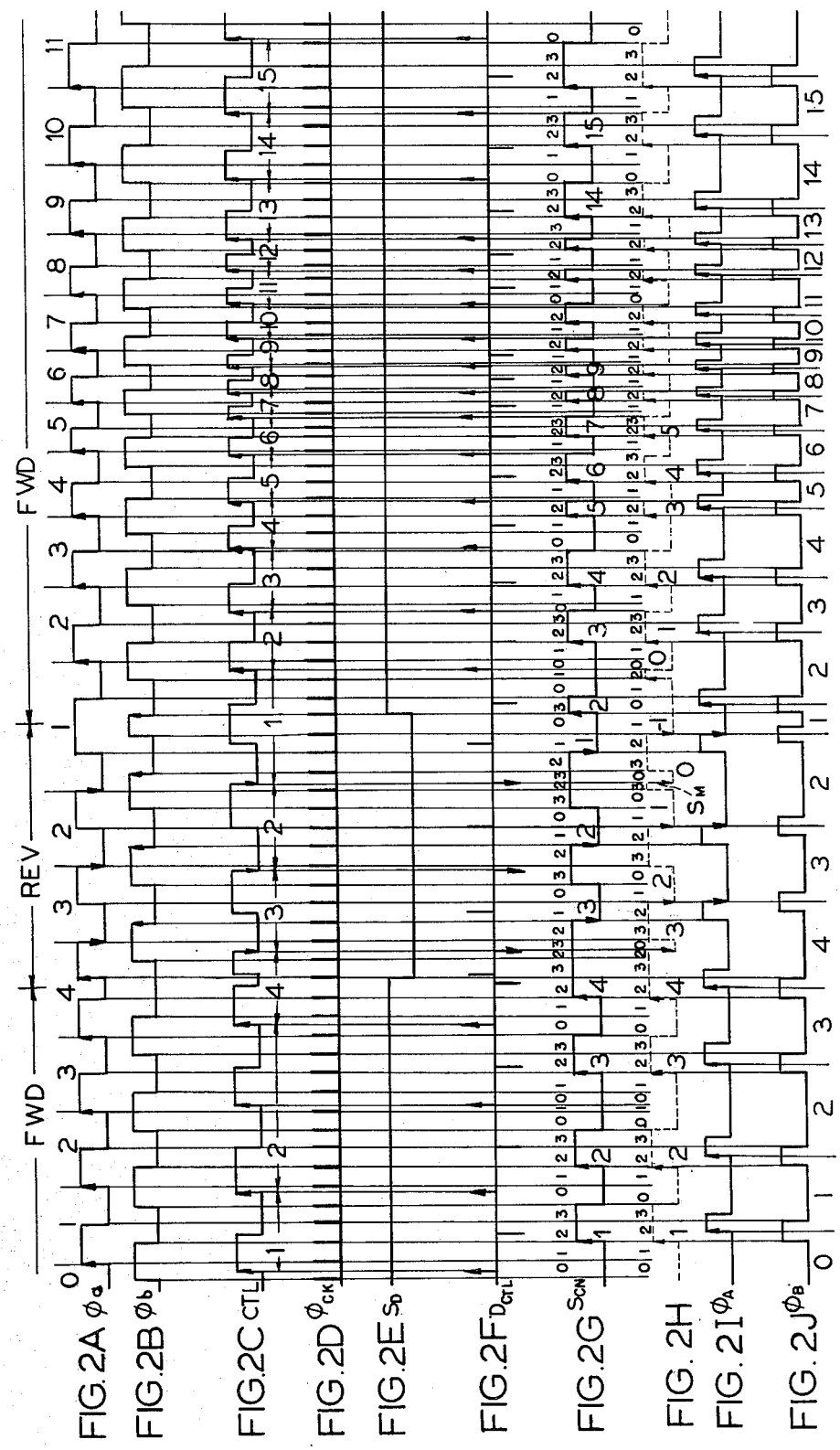
FIGS. 2A–2J are time charts illustrating the operation of the same embodiment.

The counter clock signals $\phi_a$ and $\phi_b$ are shown respectively in FIG. 2A and FIG. 2B and a control signal CTL is shown in FIG. 2C.

The counter clock signals $\phi_a$ and $\phi_b$ are fed to a clock pulse generator 7 and a direction detector 8. The clock generator 7 detects every edge of the individual counter clock signals and produces an intermediate clock signal $\phi_{CK}$ at a pulse repetition frequency equal to four times that of the counter clock signals. The direction detector 8 detects the tape running direction by comparing the phases of the counter clock signals $\phi_a$ and $\phi_b$ at all edges thereof, and provides a direction detection signal $S_D$ of logic "1" when the tape is running forward and a detection signal of logic "0" when the tape is running backward, as shown in FIG. 2E. The control signal CTL from the control track head 6 is fed to an edge selector 9, which selectively produces differential pulse signals $D_{CTL}$ synchronized to the rising or falling edges of the input control signal as shown in FIG. 2F, these differential pulses being coupled as load signals to a load input terminal of a 4-step reversible counter 10. The operation of the edge selector 9 is controlled by the direction detection signal $S_D$ from the direction detector 8.

The intermediate clock signal $\phi_{CK}$ from the clock generator 7 is coupled to a clock input terminal of the 4-step reversible counter 10, and the direction detection signal $S_D$ from the direction detector 8 is coupled to an operation control terminal of the counter. The direction detection signal $S_D$ is also coupled through an inverter 11 to a preset input terminal of the counter. Thus, the value of the direction detection signal $S_D$ coupled from the direction detector 8 through the inverter 11 is preset as initial data therein at every edge of the control signal CTL coupled through the edge selector 9, and the counter 10 produces either up-count or down-count operations in accordance with the tape running direction. More particularly, when the tape is running forward, the 4-step reversible counter 10 counts up the clock signal $\phi_{CK}$ by the control of the direction detector 8. And further, it is preset to zero in synchronism to the differential pulse signal $D_{CTL}$ in the presence of a preset input signal of logic "00". On the other hand, when the tape is running backward, the 4-step reversible counter 10 counts down the clock signal $\phi_{CK}$ by the control of the direction detection signals $S_D$ of logic 0" provided from the direction detector 8. And therefore, it is preset to three in synchronism with the differential pulse signal $D_{CTL}$ in the presence of preset input signal of logic "11".

The 4-step reversible counter 10, in which data "0" or "3" is preset according to the direction of running of the tape, provides a counter output signal $S_{CN}$ as shown in FIG. 2G. This counter output signal is fed to a two-phase clock generator 12. The two-phase clock signal generator 12 produces revised counter clock signal $\phi_A$ and $\phi_B$ of different phases as shown respectively in FIG. 2I and FIG. 2J.

As is shown, with this embodiment, in which data is preset in the 4-step reversible counter 10 according to the tape running direction, data "0" is set at every signal rise of the control signal CTL when the tape is running forward and date "3" is set at every signal fall of the control signal CTL when the tape is running backward. Errors that result at the time of the reversal of the tape running direction are cancelled, and also generation of quasi-pulse signals are prevented. The revised counter clock signals $\phi_A$ and $\phi_b$ which represent the tape running position, are produced from respective output terminals 13 and 13' of the two-phase clock signal generator 12 in accordance with the counter outout signal $S_{CN}$ from the 4-step reversible counter 10. The revised counter clock signals $\phi_A$ and $\phi_B$ thus obtained, which contain tape position information based upon the control signal CTL, do not only correspond to the frame period of the video signal but also correctly correspond to the tape running position even if the tape running speed is changed.

A specific example of the circuit construction of the above-embodiment of the present invention, which operates principally in the manner as described above, will be described with reference to FIG. 3.

Figure 3:
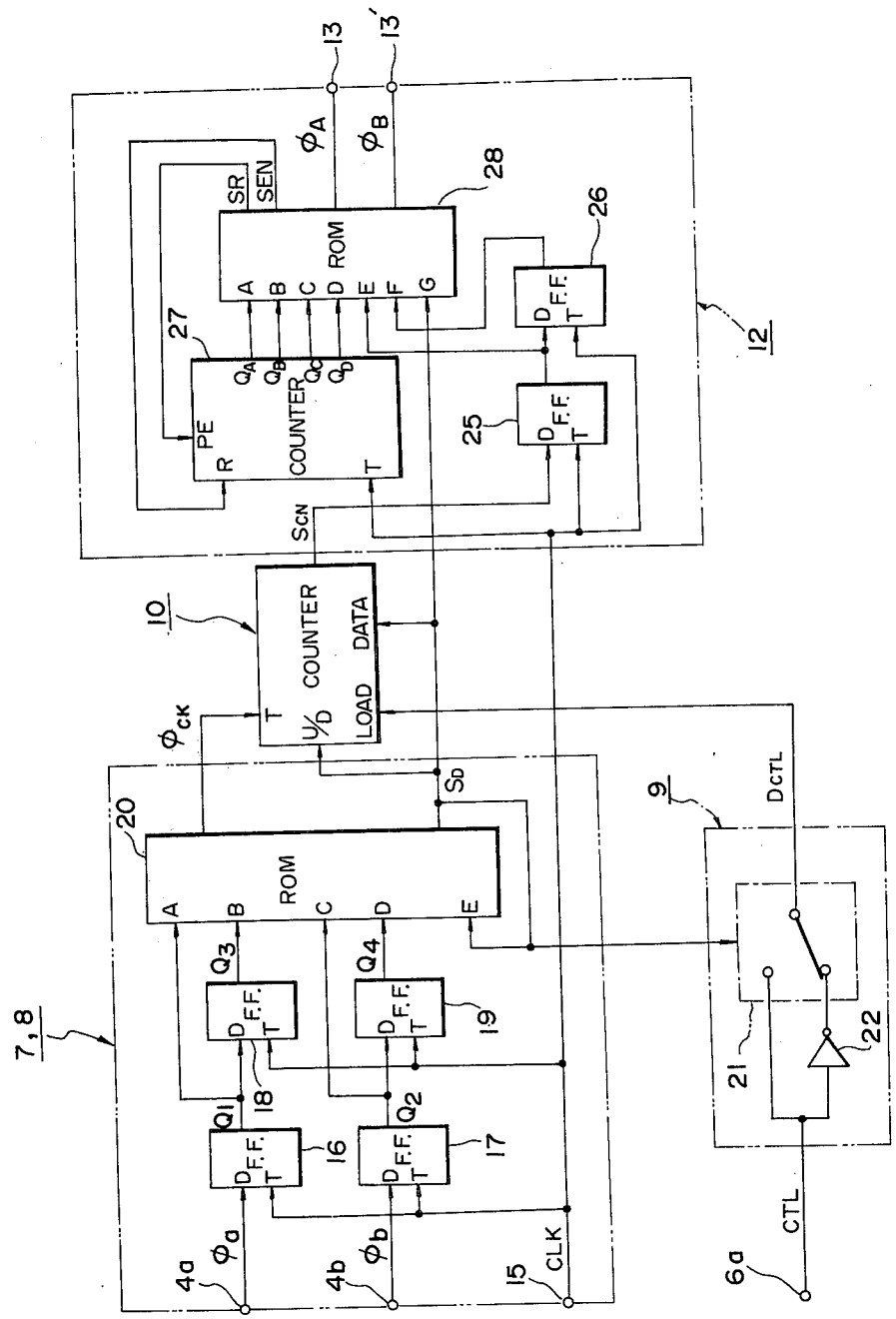
FIG. 3 is a connection diagram showing a specific example of the circuit construction of the same embodiment.

In the example shown in FIG. 3, counter clock signal $\phi_a$ from a signal input terminal 4a is coupled to a data input terminal of a first D-type flip-flop 16, and counter clock signal $\phi_b$ from a signal input terminal 4b is coupled to a data input terminal of a second D-type flip-flop 17. The counter clock signals $\phi_a$ and $\phi_b$ are supplied from the respective magnetic pick-up heads 4 and 5 (FIG. 1), and at the normal tape speed they have a pulse repetition frequency of 30 Hz. The first D-type flip-flop 16 produces a signal $DFQ_1$ at its affirmation output, which is coupled to a data input terminal of a third D-type flip-flop 18 and also to a first data input terminal A of a first programmable read only memory 20. The second D-type flip-flop 17 produces a signal $DFQ_2$ as its affirmation output, which is coupled to a data input terminal of a fourth D-type flip-flop 19 and to a third input terminal C of the first programmable read only memory 20. The third and fourth D-type flip-flops 18 and 19 produce respective signals $DFQ_3$ and $DEQ_4$ as their affirmative outputs, which are coupled to the second and fourth data input terminals B and D of the first programmable read only memory 20. A clock signal of 25KHz is supplied to clock input terminals of the first to fourth D-type flip-flops 16 to 19. These flip-flops are thus synchronized to the clock signal CLK with respect to the counter clock signals $\phi_a$ and $\phi_b$.

The first programmable read only memory 20 receives the affirmation output signals $DFQ_1$ and $DFQ_2$ from the first and second D-type flip-flops 16 and 17 and also the affirmation output signals $DFQ_3$ and $DFQ_4$ from the third and fourth D-type flip-flops 18 and 19 which lag by one clock period behind the respective affirmation output signals $DFQ_1$ and $DFQ_2$, $DFQ_2$, $DFQ_1$, $DFQ_4$ and $DFQ_3$ are shown in FIGS. 4A-4D. Memory 20 effects decoding operation in a manner as shown by the time charts of FIG. 4 to produce an intermediate clock signal $\phi_{CK}$ at a frequency of four times that of the counter clock signals $\phi_a$ and $\phi_b$ and also the direction detection signal $S_D$ corresponding to the phase difference between the counter clock signals $\phi_a$ and $\phi_b$.

The memory 20 has decoding functions such that the direction detection signal $S_D$ is set when the decode decimal is 1, 7, 14 and 8. It is reset when the decode decimal is 15, 10, 0 and 5. It is held when the decode decimal is 15, 10, 0 and 5. The intermediate clock signal $\phi_{CK}$ and direction detection signal $S_D$ provided from the first programmable read only memory 20 are supplied to 4-step reversible counter 10. In the counter 10 of FIG. 3, the inverter 11 of FIG. 1 is included therein.

The first programmable read only memory 20 is held in a decoding operation mode according to the tape running direction, and to this end the direction detection signal $S_D$ is fed back to a fifth data input terminal E. The direction detection signal $S_D$ from the first programmable read only memory 20 is used as a control signal for a switching circuit 21 contained in edge selector 9. The edge selector 9 has an inverter 22, and a signal representing the rising edges of the control signal CTL and a signal representing the falling edges thereof are selectively coupled through the switching circuit 21 to a load input terminal of the 4-step reversible counter 10.

As mentioned earlier, the 4-step reversible counter 10 effects 4-step up-counting with data "0" reset at every occurrence of the control signal CTL when the tape is running forward, while it effects 4-step down-counting with date "3" reset at every occurence of the control signal when the tape is running backward. The counter output signal $S_{CN}$ from the 4-step reversible counter 10 is fed to a data input terminal of a fifth D-type flip-flop 25 in clock generator 12. The fifth flip-flop 25 produces a signal $DFQ_5$ shown in FIG. 5B as its affirmative output which is coupled to a data input terminal of a sixth D-type flip-flop 26 and also to a fifth data input terminal E of a second programmable read only memory 28. The sixth flip-flop 26 produces a signal $DFQ_6$ shown in FIG. 5A as its affirmation output, which is coupled to a sixth data input terminal F of the second programmable read only memory 28. The fifth and sixth D-type flip-flops 25 and 26 are triggered by the 25-kHz clock signal CLK to effect inverting action according to the logic state at the data input terminal. The affirmation output signal $DFQ_6$ produced from the sixth flip-flop 26 lags by one clock interval behind the affirmation output signal $DF_5$ produced from the fifth flip-flop 25.

The second programmable read only memory 28 receives at its first to fourth data input terminals A to D respective four-bit count output signals $Q_A$ to $Q_D$ from a 16-step up-counter 27, which counts the 25-kHz clock signal CLK from the signal input terminal 15 and also receives at its seventh data input terminal G the direction detection signal $S_D$ from the first programmable read only memory 20, and it effects decoding operation in a manner as shown by the time charts of FIGS. 5A–5H. More particularly, the second programmable read only memory 28 produces a reset signal $S_R$ shown in FIG. 5G by selecting either the rising or falling edges of the affirmation output signals $DFQ_5$ and $DFQ_6$ based on the logic value of the direction detection signal $S_D$ (FIG. 5C) (i.e., the tape running direction). The reset signal thus produced is fed back to a reset input terminal of the 16-step up-counter 27, and when 15 of the 25-kHz clock signal pulses are counted by the 16-step counter 27 after the supply of the reset signal, the memory 28 supplies a count stop signal $S_{EN}$ (FIG. 5H) to the 16-step up-counter 27 while also producing the revised counter clock signals $\phi_A$ (FIG. 5E) and $\phi_B$ (FIG. 5F) of the difference phases based on the 4-bit count outputs $Q_A$ to $Q_D$ from the 16-step up-counter 27 and the direction detection signal $S_D$.

As has been shown, unlike the usual method of presetting the 4-step reversible counter 10 to "0" at every reversal of the tape running direction, wherein an undesired pulse signal $S_M$ as shown by an imaginary waveform line in FIG. 2H it is not possible to generate the afore-mentioned undesired pulse signal $S_M$, so it is possible to prevent accumulation of errors and to obtain the revised counter clock signals $\phi_A$ and $\phi_B$, which accurately indicate the prevailing position of the running tape and also correspond to the frame period, from the two-phase clock generator 12.

As has been made apparent from the above-embodiment, according to the present invention two different phase counter clock signals at a pulse repetition frequency corresponding to the tape running speed are processed to obtain a direction detection signal indicating the direction of running of the tape and a clock signal at a frequency of four times that of the two different phase counter clock signals, and the clock signal thus obtained is counted by a 4-step reversible counter, which is controlled by switching between up-counting and down-counting by the direction detection signal with data "0" preset when the tape is running forward and data "3" preset when the tape is running backward, for producing two revised counter clock signals of different phases according to the count output signal from the 4-step reversible counter.

It is possible to provide a counting pulse generating circuit for a tape counter, which eliminates the possibility of generation of errors at the reversal of the tape running direction and is also capable of sufficiently following the changes of the tape running speed to produce revised counter pulse signals indicating the accurate tape position corresponding to the frame period of a video signal.

While in the above embodiment a 4-step reversible counter has been used, it is possible to use reversible counters of other systems, for instance an 8-step counter. In this case, data "7" is preset during reverse running of the tape. In general, the maximum value is to be preset in the reverse running mode of the tape at every occurance of the control pulse.

Although the invention has been described with respect to preferred embodiments, it is not to be so limited as changes and modifications can be made which are within the full intended scope of the invention as defined by the appended claims.

We claim as our invention:

1. A time counting clock generator for a video tape recorder comprising, a pulse generator for generating a pulse signal indicative of tape velocity in response to the movement of a video tape, a direction indicating pulse generator for generating a direction indicating pulse output from said pulse signal, a dividing counter for dividing said pulse signal for generating a timer counting clock signal, said direction indicating pulse output being supplied to an up-down control input of said dividing counter, a control signal reproducing circuit for reproducing control signals recorded on said video tape, and a counter presetting means for presetting said dividing counter to zero when said direction indicating pulse output indicates forward movement of said video tape and to the maximum value when said direction indicating pulse output indicates reverse movement of said video tape at each occurrence of said control signal.

2. A time counting clock generator as claimed in claim 1, wherein said dividing counter is a ¼ divider, said ¼ divider being preset to three in decimal at the occurrence of said control signal when the direction indicating pulse output indicates reverse movement of said tape.

3. A time counting clock generator as claimed in claim 1, wherein said pulse generator generates a pair of pulses with the phases thereof being different by about 90° from each other.

4. A time counting clock generator as claimed in claim 1, wherein said direction indicating pulse output is supplied to a data input terminal of said dividing counter through an inverter.

5. A time counting clock generator as claimed in claim 3, wherein said pair of pulses from said pulse generator are utilized to produce a resultant clock signal having a frequency of four times that of the original pulse signal generated from said pulse generator, and said resultant clock signal being supplied to a clock terminal of said dividing counter.

6. A counting time clock generator for a video tape recorder video tape having a control signal recorded thereon comprising, a control signal producing means detecting the control signal on said tape, a roller engaged by said tape and rotated thereby, a magnetic wheel with a plurality of magnetic areas connected to said roller and rotatable therewith, a pair of magnetic pick-ups mounted 90 degrees relative to each other to detect the magnetic areas on said magnetic wheel, a direction detector circuit receiving outputs from said pair of magnetic heads to determine the direction of travel of said tape, a first clock generator receiving outputs from said pair of magnetic heads and producing a pulse train output, an up-down counter receiving the outputs of said first clock generator, said direction detector circuit and said control signal producing means, and a second clock generator receiving an output from said up-down counter and producing two output pulse trains which differ in phase depending upon the direction of travel of said tape.

7. A counting time clock generator for a video tape having a control signal recorded thereon comprising, a control signal producing means detecting the control signal on said tape, means for inverting the output of said control signal producing means as a function of the tape direction, a roller engaged by said tape and rotated thereby, a magnetic wheel with a plurality of magnetic areas connected to said roller and rotatable therewith, a first read only memory receiving inputs from first, second, third and fourth flip-flop circuits, means for inverting the output of said control circuit receiving an output of said first read only memory, an up-down counter receiving outputs from said first read only memory and said means for inverting the output of said control circuit, fifth and sixth flip-flop circuits receiving inputs from said clock source, a pair of magnetic pick-ups mounted 90 degrees relative to each other to detect the magnetic areas on said magnetic wheel, a time clock source, said first and second flip-flop circuits receiving inputs from said clock source and each receiving an output from one of said pair of magnetic pick-ups, said third and fourth flip-flop circuits receiving inputs from said clock source and each receiving an output from one of said first and second flip-flop circuits, and inputs from said up-down counter, a counter and a second read only memory receiving inputs from said clock source and said counter supplying a plurality of outputs to said second read only memory, said fifth and sixth flip-flop circuits supplying outputs to said second read only memory, and said read only memory supplying inputs to said counter and producing a pair of output clock signals.

* * * * *